(12) United States Patent
Kawanishi

(10) Patent No.: US 9,279,191 B2
(45) Date of Patent: Mar. 8, 2016

(54) PATTERN FORMING METHOD

(71) Applicant: Kabushiki Kaisha Toshiba, Tokyo (JP)

(72) Inventor: Ayako Kawanishi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 425 days.

(21) Appl. No.: 13/784,620

(22) Filed: Mar. 4, 2013

(65) Prior Publication Data

US 2014/0069325 A1 Mar. 13, 2014

(30) Foreign Application Priority Data

Sep. 7, 2012 (JP) ................................ P2012-197467

(51) Int. Cl.
*C30B 19/00* (2006.01)
*H01L 21/027* (2006.01)
(Continued)

(52) U.S. Cl.
CPC ............. *C30B 19/00* (2013.01); *B81C 1/00031* (2013.01); *H01L 21/0271* (2013.01); *H01L 21/31144* (2013.01); *B81C 2201/0149* (2013.01); *B81C 2201/0198* (2013.01)

(58) Field of Classification Search
CPC ..... C08L 2666/24; C08L 53/00; C08L 25/08; C08F 8/00; C09J 7/0221; H01L 21/02282; H01L 21/0337; H01L 21/3086; G03F 7/0002; G03F 7/038; G03F 7/165; G03F 7/40; G03F 7/004; G01N 2610/00; B81C 1/00031; B81C 2201/0149
USPC ........................................ 430/322, 324, 330
See application file for complete search history.

(56) References Cited

U.S. PATENT DOCUMENTS

| 8,114,300 | B2 | 2/2012 | Millward |
| 2008/0052022 | A1 | 2/2008 | Tanaka et al. |
| 2008/0193658 | A1* | 8/2008 | Millward ...................... 427/401 |

(Continued)

FOREIGN PATENT DOCUMENTS

| JP | 2008036491 A | 2/2008 |
| JP | 2010053263 A | 3/2010 |
| JP | 2012005939 A | 1/2012 |

OTHER PUBLICATIONS

E.W. Edwards et al; "Precise Control over Molecular Dimensions of Block-Copolymer Domaines Using the Interfacial Energy of Chemically Nanopatterned Substrates"; Advanced Materials; 2004; vol. 16, No. 15; Aug. 4, 2004.

(Continued)

*Primary Examiner* — Caleen Sullivan
(74) *Attorney, Agent, or Firm* — Patterson & Sheridan, LLP

(57) ABSTRACT

According to one embodiment, a pattern forming method includes forming a graphoepitaxy on a substrate, a process of forming a first self-assembly material layer that contains a first segment and a second segment in a depressed portion of the graphoepitaxy, a process of forming a first self-assembly pattern that has a first region containing the first segment, and a second region containing the second segment by performing a phase separation of the first self-assembly material layer, a process of forming a second self-assembly material layer containing a third segment and a fourth segment on a projected portion of the graphoepitaxy, and the first self-assembly pattern, a process of forming a second self-assembly pattern that has a third region containing the third segment, and a fourth region containing the fourth segment by performing a phase separation of the second self-assembly material layer.

16 Claims, 9 Drawing Sheets

(51) Int. Cl.
   *H01L 21/311* (2006.01)
   *B81C 1/00* (2006.01)

(56) References Cited

U.S. PATENT DOCUMENTS

2008/0217292 A1  9/2008  Millward et al.
2010/0297847 A1  11/2010  Cheng et al.
2011/0281085 A1  11/2011  Tada et al.
2011/0312185 A1  12/2011  Seino

OTHER PUBLICATIONS

Office Action mailed Jan. 19, 2015, filed in corresponding Japanese Patent Application No. 2012-97467, with English translation.

* cited by examiner

PATTERN FORMING METHOD

CROSS-REFERENCE TO RELATED APPLICATION

This application is based upon and claims the benefit of priority from Japanese Patent Application No. 2012-197467, filed Sep. 7, 2012; the entire contents of which are incorporated herein by reference.

FIELD

Embodiments described herein relate to a pattern forming method.

BACKGROUND

Conventional lithography technology for manufacturing a semiconductor device includes double patterning technology by ArF liquid immersion exposure, EUV lithography, nanoimprint, etc. With the miniaturization of the pattern, the conventional lithographic technology suffers various problems, such as an increase in cost, and a decrease in throughput.

Under such circumstances, application of the self-assembly (DSA: Directed Self-assembly) to a lithography technology has been explored. Since self-assembly is caused by a spontaneous behavior called energy stability, the self-assembly can form a pattern with high dimensional accuracy. In particular, the technology of using microphase separation of the polymer block copolymer can form the periodic structure of various shapes in several to several hundred nanometers (nm) in a simple coating and annealing process. By changing the shape into a sphere, cylinder, and lamella, etc. according to the composition ratio of a high molecular block copolymer, and changing size according to a molecular weight, the dot pattern of various sizes, a hole or a pillar pattern, a line pattern, etc. can be formed.

In order to form a desired pattern extensively using DSA, it is necessary to prepare an epitaxy that controls the generating position of the polymer phase formed by self-assembly. Epitaxy may include a structure consisting of a plurality of projected surfaces and a plurality of depressed surfaces, and the following epitaxies have been known: graphoepitaxy that forms a microphase separation pattern in a depressed portion of the structure, and chemical epitaxy that is formed in a lower layer of DSA material, and controls the formation position of a microphase separation pattern based on a difference in the surface energy.

When chemical epitaxy is used, a microphase separation pattern can be formed all over a substrate (e.g., wafer). However, when graphoepitaxy is used, a microphase separation pattern cannot be formed on the projected portion of the graphoepitaxy, and the substrate is not able to be used effectively as a portion of the substrate cannot be patterned.

DETAILED DESCRIPTION

Embodiments provide a method for forming a pattern that carries out a microphase separation of the self-assembly material using graphoepitaxy.

In general, embodiments will be described with reference to the accompanying drawings.

According to one embodiment, the pattern forming method includes a process of forming a graphoepitaxy that has a structure on a substrate, the structure may include a plurality of projections and a plurality of depressions formed in a grid or array. The pattern forming method also includes a process of forming a first self-assembly material layer that contains at least a first segment and a second segment in the depressed portion (in the plurality of depressions) of the graphoepitaxy, a process of forming the first self-assembly pattern having a first region containing the first segment and a second region containing the second segment by carrying out a phase separation of the first self-assembly material layer, a process of forming the second self-assembly material layer containing a third segment and a fourth segment on the projected portion (on a surface of the plurality of projections) of the graphoepitaxy, and a surface of the first self-assembly pattern, and a process of forming the second self-assembly pattern having the third region containing the third segment, and the fourth region containing the fourth segment by carrying out a phase separation of the second self-assembly material layer.

First Embodiment

The pattern forming method of the first embodiment will be explained using the FIG. 1 to FIG. 7.

Figure 1:
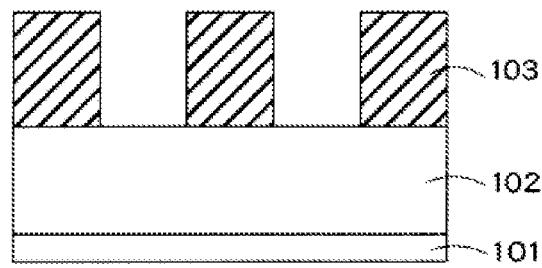
FIGS. 1-7 are cross-sectional views illustrating a sequence of steps of a pattern forming method according to a first embodiment.

First, as shown in FIG. 1, on the substrate 101, a film 102 to be processed is formed. The film 102 may be an $SiO_2$ film having 100 nm in film thickness formed by CVD, for example. A resist pattern 103 is formed by spin coating and exposure to and development by an argon fluorine (ArF) excimer laser. The resist pattern having 100 nm in film thickness is processed into a line-and-space pattern of 75 nanometer (nm) half pitch. At this time, although it is not shown in the drawing, it is also possible to form an antireflection film between the layers of the resist 103 and the film 102 to be processed. FIG. 1 shows a part of a line-and-space pattern. When a block polymer formed in a subsequent process carries out a microphase separation, this line and space pattern has a function as a graphoepitaxy that controls the formation position of a microphase separation pattern.

Figure 2:
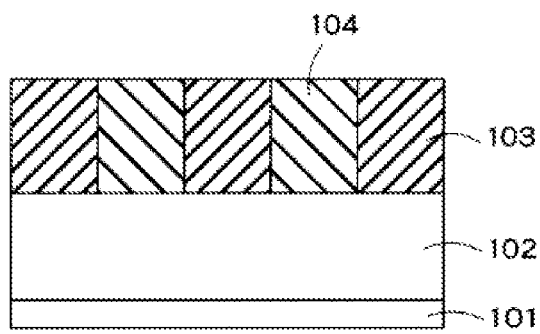

Next, as shown in FIG. 2, a block polymer layer 104 is formed in the depressed portions of the resist 103 so that the concave portion of the resist pattern 103 may be embedded. For example, the block polymer layer 104 is formed by carrying out a spin coating of a poly ethylene-glycol-monomethyl-ether acetate (PGMEA) solution (solution 1) that contains the block copolymer (PS-b-PMMA) of polystyrene (PS) and polymethyl methacrylate (PMMA) at a concentration of 2.0 wt % at 1500 rpm rotational speed.

Figure 3:
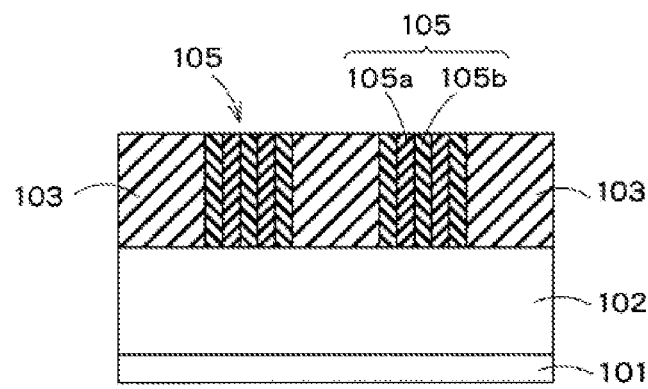

Next, as shown in FIG. 3, using a hot plate, the substrate 101 is heated for 90 seconds at 110° C. and further heated for 3 minutes at 220° C. in nitrogen atmosphere. Thus, the block polymer layer 104 forms a lamella self-assembly pattern 105 in which a laminated first polymer part 105a containing a first polymer block chain and a laminated second polymer part 105b containing a second polymer block chain are arranged in alternating layers. For example, the lamella self-assembly pattern 105 of 15 nm half pitch is formed.

Figure 4:
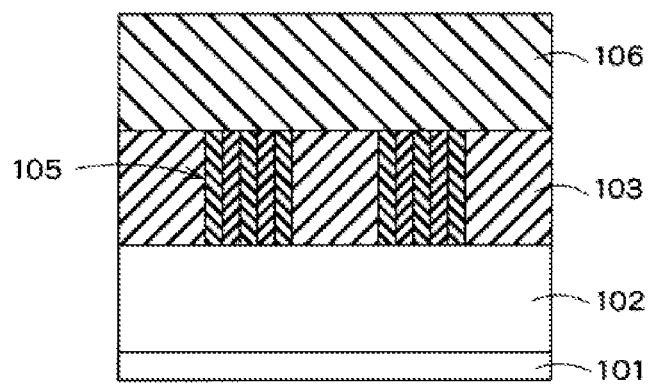

Next, as shown in FIG. 4, a block polymer layer 106 is formed on the surfaces of the projected portion of the resist pattern 103 and the self-assembly pattern 105. For example, similar to the block polymer layer 104, the block polymer layer 106 having 100 nm in film thickness is formed by carrying out a spin coating of a poly ethylene-glycol-monomethyl-ether acetate (PGMEA) solution (solution 2) that contains the block copolymer (PS-b-PMMA) of polystyrene (PS) and polymethyl methacrylate (PMMA) at a concentration of 2.0 wt % at 1500 rpm rotational speed.

Figure 5:
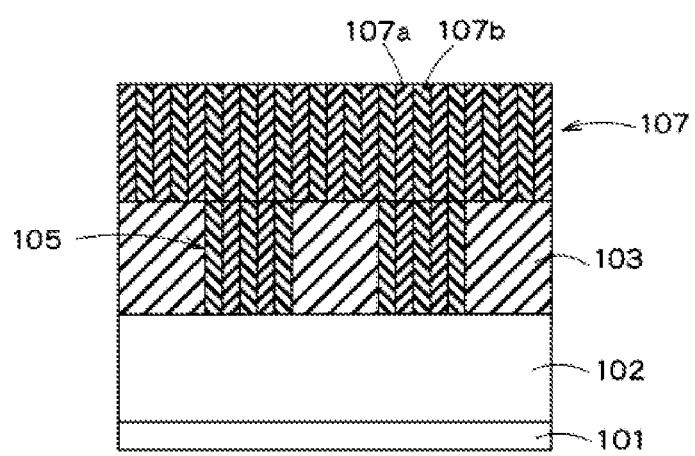

Next, as shown in FIG. 5, the substrate 101 is heated for 90 seconds at 110° C. on a hot plate, and further heated for 3 minutes at 220° C. in nitrogen atmosphere. Thus, the block polymer layer 106 forms a lamella self-assembly phase 107 in which a laminated first polymer portion 107a containing the first polymer block chain and a laminated second polymer portion 107b containing the second polymer block chain are arranged in alternate layers. The block polymer layer 106 forms the self-assembly pattern 107 by considering the lower layer self-assembly pattern 105 as a chemical epitaxy. For example, the lamella self-assembly pattern 107 of 15 nm half pitch similar to the self-assembly pattern 105 is formed.

In addition, when applying the PGMEA solution of a block copolymer on the self-assembly pattern 105, the phase separation pattern of the self-assembly pattern 105 may be dissolved with the solvent (PGMEA in the example). Such a problem can be prevented by using a solvent type that is different with the first solution applied in the process shown in FIG. 2, and the second solution applied in the process shown in FIG. 4. Or the above problems can be prevented by adding a cross-linking agent (thermal cross-linking agent) to the first solution, and cross-linking again after forming the phase separation pattern of the self-assembly pattern 105, then applying the second solution. Changing a solvent type or adding a cross-linking agent to the solution is not limited to the first solution and the second solution; they can also be applied if needed when repeatedly applying the solution of a block copolymer in a subsequent process.

The self-assembly pattern 107 has the same pattern as the self-assembly pattern 105, the first polymer portion 107a is located on the first polymer portion 105a, and the second polymer portion 107b is located on the second polymer portion 105b. Moreover, the self-assembly phase 107 is also formed on the projected portion of the resist pattern 103.

Figure 6:
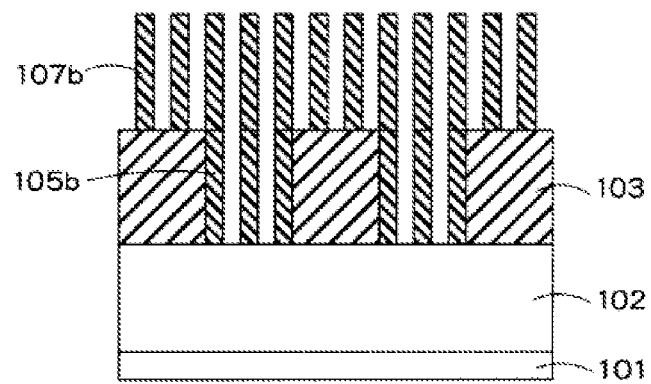

Next, as shown in FIG. 6, a line-and-space pattern of high aspect ratio can be obtained by removing alternatively the first polymer portion 105a and 107a (for example, the first polymer portions 105a and 107a that include PMMA (s)) in self-assembly patterns 105 and 107 by development process.

Figure 7:
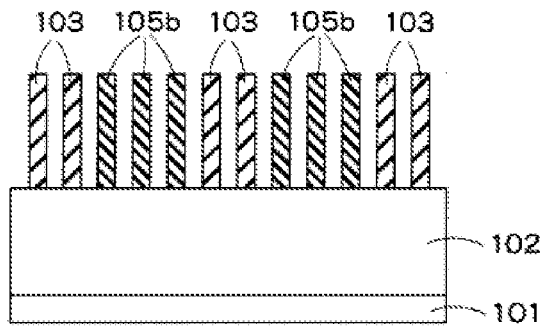

Next, as shown in FIG. 7, the second polymer portion 107b and the resist pattern 103 of the self-assembly pattern 107 is etched back. At this time, it etches so that the selection ratio of the second polymer portion 107b of the self-assembly phase 107 and the resist pattern 103 may become equivalent. In other words, the resist 103 is processed by masking the second polymer portion 107b. Thus, the pattern shape of the second polymer portion 107b of the self-assembly pattern 107 is transferred to the resist 103.

Then, the film 102 to be processed is processed by masking the second polymer portion 105b and the resist 103 of the self-assembly pattern 105.

Thus, in the present embodiment, the first microphase separation pattern (self-assembly pattern 105) is formed in the graphoepitaxy (resist pattern 103), the second microphase separation pattern (self-assembly phase 107) is formed by using these as the chemical epitaxy on the graphoepitaxy and the first microphase separation pattern, and the pattern shape of the second microphase separation pattern is transferred to the graphoepitaxy. The graphoepitaxy in which the pattern shape of the second microphase separation pattern is transferred can be used as a processing mask of a film to be processed like the first microphase separation pattern. Therefore, the area in which the graphoepitaxy is formed does not become useless, as the area may be patterned, so the substrate can be used effectively.

Although the resist pattern that serves as a graphoepitaxy by exposure and development is formed by the ArF excimer laser in the first embodiment, a graphoepitaxy by optical lithography, such as ArF liquid immersion exposure and EUV, nanoimprint, etc. may be formed. Moreover, a surface treatment to the graphoepitaxy may be performed if needed. For example, light irradiation may be performed in the depressed portion and projected portion of the graphoepitaxy that become the base of the self-assembly patterns 105 and 107, and a contact angle of the surface may be controlled, i.e., the depressed portion and projected portion of the graphoepitaxy can have a neutral (non-preferential) surface for polystyrene (PS) and polymethyl methacrylate (PMMA).

Second Embodiment

FIG. 8 to FIG. 16 are cross-sectional views illustrating the pattern forming method concerning the second embodiment. It differs in that this embodiment forms a graphoepitaxy through the neutral film 110 on the film 102 to be processed as compared with the first embodiment shown in the FIG. 1 to FIG. 7. In the FIG. 8 to FIG. 16, the portion that is the same as the first embodiment shown in FIG. 1 to FIG. 7 will be given the same reference numerals and a detailed description thereof will be omitted.

Figure 8:
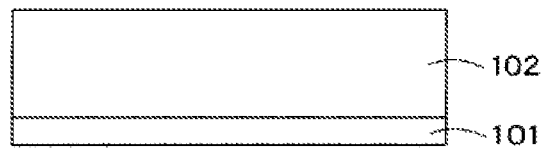
FIGS. 8-16 are cross-sectional views illustrating a sequence of steps of a pattern forming method according to a second embodiment.

First, as shown in FIG. 8, the film 102 to be processed on the substrate 101 is formed.

Figure 9:
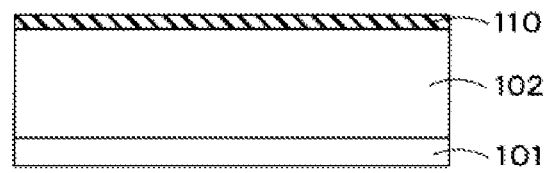

Next, as shown in FIG. 9, the neutral film 110 is formed on the film 102 to be processed. For example, the neutral film 110 is formed by carrying out a spin coating of the poly ethylene-glycol-monomethyl-ether acetate (PGMEA) solution that contains the random copolymer (PS-r-PMMA) of polystyrene (PS) and polymethyl methacrylate (PMMA) at a concentration of 1.0 wt % at 1500 rpm rotational speed on the film 102 to be processed, and by baking for 90 seconds at 110° C. and for 3 minutes at 240° C. on a hot plate.

Figure 10:
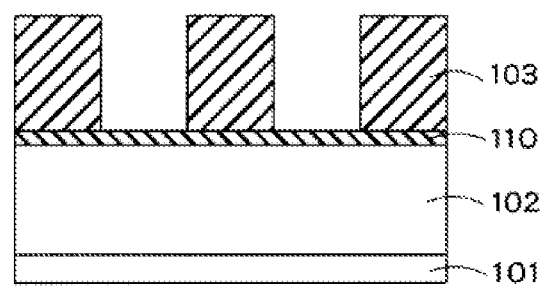

Next, as shown in FIG. 10, spin coating of the resist 103 is carried out, it is exposed and developed with an ArF excimer laser, and processed into a line-and-space pattern of the half-pitch 75 nm. At this time, although not shown in the drawing, it is also possible to form an antireflection film between the layers of the resist 103 and the film 102 to be processed.

Figure 11:
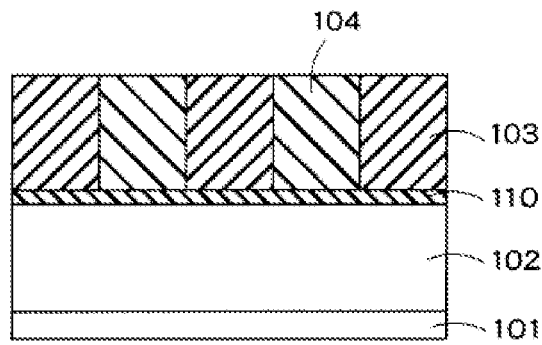

Next, as shown in FIG. 11, the poly ethylene-glycol-monomethyl-ether acetate (PGMEA) solution (solution 1) that contains the block copolymer (PS-b-PMMA) of polystyrene (PS) and polymethyl methacrylate (PMMA) at a concentration of 2.0 wt % is applied to the concave portion of the resist pattern 103, and the block polymer layer 104 is formed.

Figure 12:
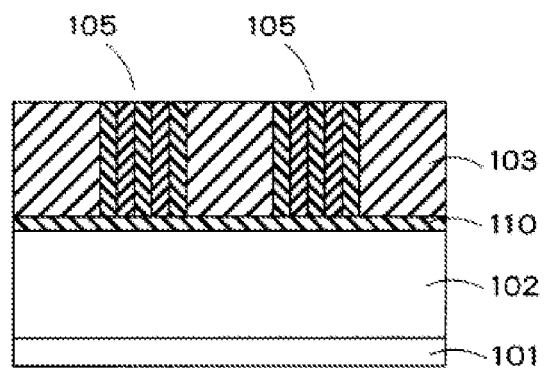

Next, as shown in FIG. 12, the substrate 101 is heated, microphase separation of the block polymer layer 104 is carried out, and the lamella self-assembly pattern 105 is formed. For example, the lamella self-assembly pattern 105 of 15 nm half pitch is formed. Since the neutral film 110 is formed under the block polymer layer 104, as compared with the first embodiment, microphase separation of the block polymer layer 104 is carried out easily.

Figure 13:
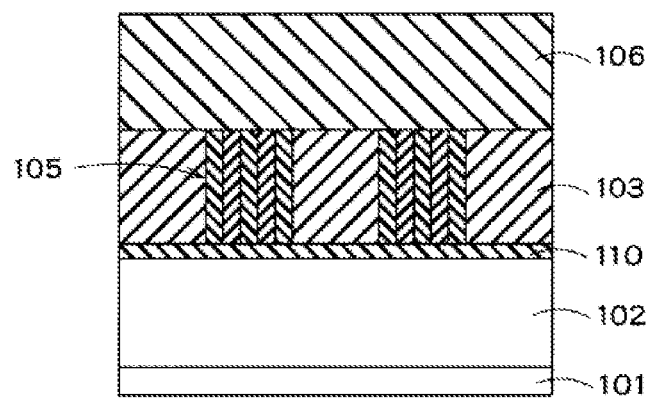

Next, as shown in FIG. 13, the poly ethylene-glycol-monomethyl-ether acetate (PGMEA) solution (the second solution) that contains the block copolymer (PS-b-PMMA) of polystyrene (PS) and polymethyl methacrylate (PMMA) at a concentration of 2.0 wt % is applied on the convex portion of the resist pattern 103, and the self-assembly pattern 105, and the block polymer layer 106 is formed.

Figure 14:
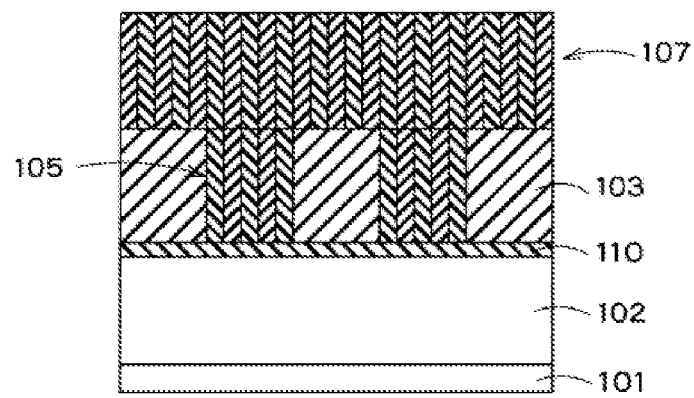

Next, as shown in FIG. 14, the substrate 101 is heated, microphase separation of the block polymer layer 106 is carried out, and the self-assembly pattern 107 is formed. The block polymer layer 106 forms the self-assembly pattern 107 by considering the lower layer self-assembly pattern 105 as a chemical epitaxy. For example, the lamella self-assembly pattern 107 of 15 nm half pitch similar to the self-assembly pattern 105 is formed.

In addition, when applying the PGMEA solution of a block co-polymer on the self-assembly pattern 105, the phase separation pattern of the self-assembly pattern 105 may be dissolved with a solvent (PGMEA in this case, for example). Such a problem can be prevented by using a solvent type that is different than the first solution applied in the process shown in FIG. 11, and the second solution applied at the process shown in FIG. 13. Or the problems can also be prevented by adding a cross-linking agent (thermal cross-linking agent) to solution 1, and cross-linking after forming the phase separation pattern of the self-assembly pattern 105, then applying the second solution. Changing the solvent type or adding a cross-linking agent to the solution are not limited to the first solution and the second solution, but they can also be applied if needed when repeatedly applying the solution of a block copolymer in the subsequent process.

Figure 15:
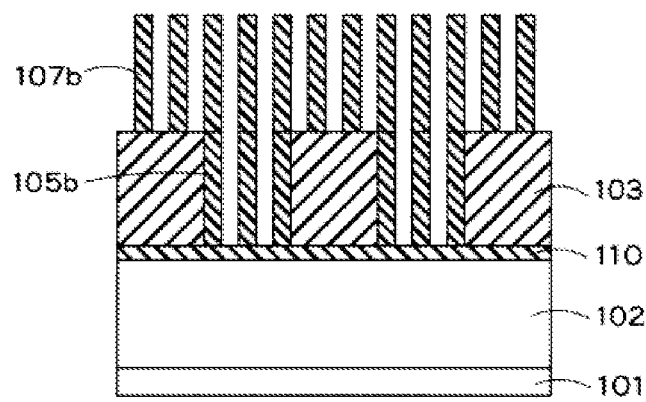

Next, as shown in FIG. 15, the development process removes alternatively the first polymer portions 105a and 107a (for example, first polymer portions 105a and 107a that include PMMA (s)) in the self-assembly patterns 105 and 107.

Figure 16:
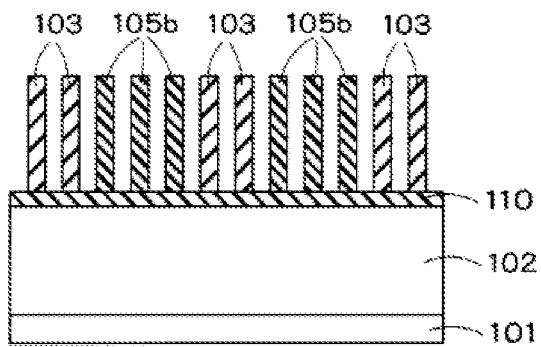

Next, as shown in FIG. 16, the resist pattern 103 is processed by masking the second polymer portion 107b of the self-assembly pattern 107.

Then, the neutral film 110 and the film 102 to be processed are processed by masking the second polymer portion 105b and the resist 103 of the self-assembly pattern 105.

Similarly to the first embodiment, in the present embodiment, the first microphase separation pattern is formed in graphoepitaxy, the second microphase separation pattern is formed by using these as a chemical epitaxy on the graphoepitaxy and first microphase separation pattern, and the pattern shape of the second microphase separation patterns is transferred to the graphoepitaxy. This graphoepitaxy can be used as a processing mask of a film to be processed like the first microphase separation pattern. Therefore, the area in which the graphoepitaxy is formed does not become useless, so the substrate can be used effectively. Moreover, in the present embodiment, since the neutral film is prepared under the graphoepitaxy, the first microphase separation pattern can be formed easily.

Third Embodiment

FIG. 17 to FIG. 27 are used for explaining the pattern forming method by the third embodiment.

Figure 17:
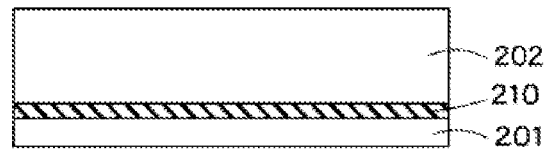
FIGS. 17-27 are cross-sectional views illustrating a sequence of steps of a pattern forming method according to a third embodiment.

First, as shown in FIG. 17, a neutral film 210 is formed on a substrate 201. For example, the neutral film 210 is formed by carrying out a spin coating of the poly ethylene-glycol-monomethyl-ether acetate (PGMEA) solution that contains the random copolymer (PS-r-PMMA) of polystyrene (PS) and polymethyl methacrylate (PMMA) at a concentration of 1.0 wt % at 1500 rpm rotational speed on the substrate 201 and by baking for 90 seconds at 110° C. and 3 minutes at 240° C. on a hot plate.

Then, an $SiO_2$ film having 100 nm in film thickness is formed by CVD, for example, on the neutral film 210, and a film 202 to be processed is formed.

Figure 18:

Next, as shown in FIG. 18, a neutral film 211 is formed on the film 202 to be processed. The neutral film 211 can be formed by the same method as the neutral film 210.

Figure 19:
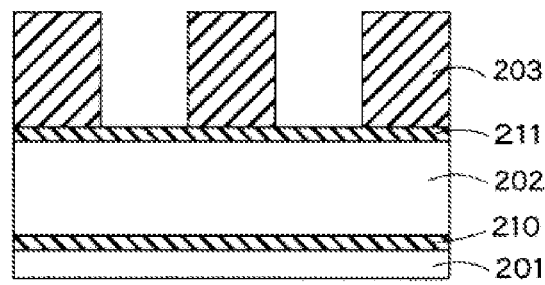

Next, as shown in FIG. 19, the spin coating of a resist 203 having 120 nm in film thickness is carried out, it is exposed and developed with an ArF excimer laser, and then processed into a line-and-space pattern of 75 nm half-pitch. FIG. 19 shows a portion of a line-and-space pattern.

Figure 20:
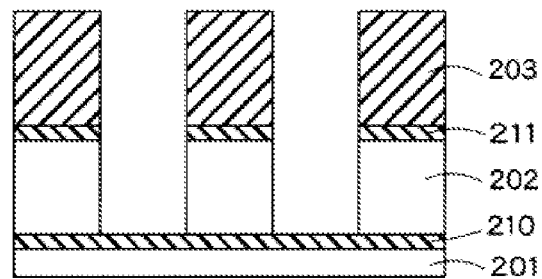

Next, as shown in FIG. 20, the neutral film 211 and the film 202 to be processed are processed by using the resist 203 as a mask.

Figure 21:
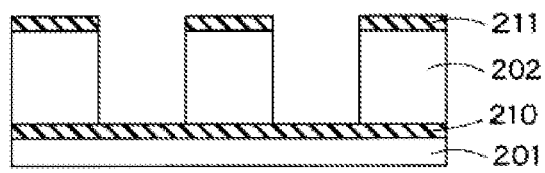

Next, as shown in FIG. 21, the resist 203 is removed. Thus, the graphoepitaxy using the film 202 to be processed is obtained. This graphoepitaxy has a function that controls the formation position of a microphase separation pattern when the block polymer formed at a next process carries out microphase separation. At this time, the neutral film 211 on the film 202 to be processed remains.

Figure 22:
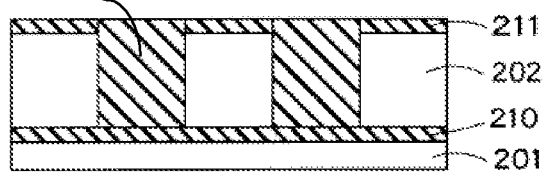

Next, as shown in FIG. 22, a block polymer layer 204 is formed in the depressed portions of the film 202 so that the concave portion (portion to which the neutral film 210 is exposed) of a graphoepitaxy may be embedded. For example, the block polymer layer 204 is formed by carrying out a spin coating of the poly ethylene-glycol-monomethyl-ether acetate (PGMEA) (solution 1) that contains the block copolymer (PS-b-PMMA) of polystyrene (PS) and polymethyl methacrylate (PMMA) at a concentration of 1.0 wt % at 1500 rpm rotational speed.

Figure 23:
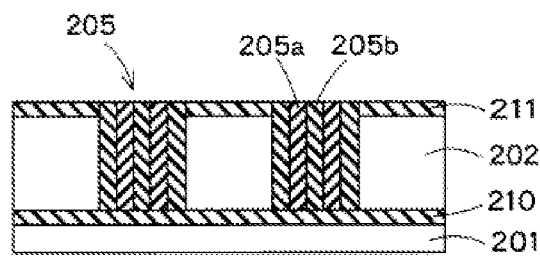

Next, as shown in FIG. 23, the substrate 201 is heated for 90 seconds at 110° C. on a hot plate, and further heated for 3 minutes at 220° C. in nitrogen atmosphere. Thus, the block polymer layer 204 forms a lamella self-assembly pattern 205 in which a laminated first polymer portion 205a containing the first polymer block chain and a laminated second polymer portion 205b containing the second polymer block chain are arranged in alternate layers. For example, the lamella self-assembly pattern 205 of 15 nm half pitch is formed. Since the neutral film 210 is formed under the block polymer layer 204, microphase separation of the block polymer layer 204 can be carried out easily.

Figure 24:
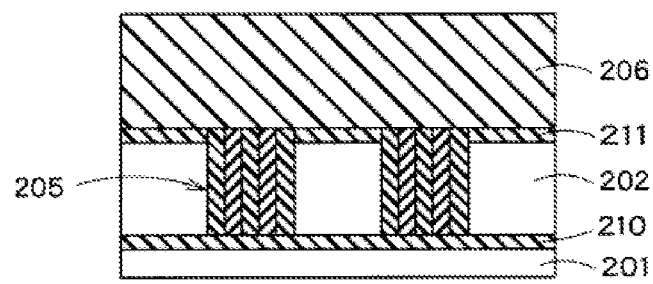

Next, as shown in FIG. 24, a block polymer layer 206 is formed on the film 202 (neutral film 211) to be processed and the self-assembly pattern 205. For example, similarly to the block polymer layer 204, the block polymer layer 206 having a film thickness of 100 nm is formed by carrying out a spin coating of the poly ethylene-glycol-monomethyl-ether acetate (PGMEA) (second solution) that contains the random copolymer (PS-b-PMMA) of polystyrene (PS) and polymethyl methacrylate (PMMA) at a concentration of 1.0 wt % at 1500 rpm rotational speed.

Figure 25:
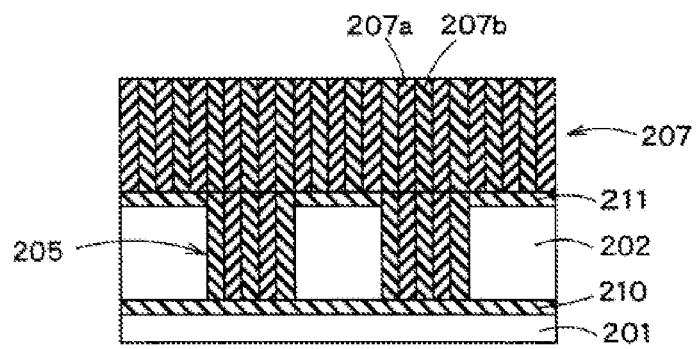

Next, as shown in FIG. 25, the substrate 201 is heated for 90 seconds at 110° C. on a hot plate, and further heated for 3 minutes at 220° C. in nitrogen atmosphere. Thus, the block polymer layer 206 forms a lamella self-assembly phase 207 in which a laminated first polymer portion 207a containing the first polymer block chain and a laminated second polymer portion 207b containing the second polymer block chain are alternately arranged (alternating layers). The block polymer layer 206 forms the self-assembly pattern 207 by considering the lower layer self-assembly pattern 205 as the chemical epitaxy. For example, the lamella self-assembly pattern 207 of 15 nm half pitch similar to the self-assembly pattern 205 is formed.

The self-assembly pattern 207 has the same pattern as the self-assembly pattern 205, the first polymer portion 207a is located on the first polymer portion 205a, and the second polymer portion 207b is located on the second polymer portion 205b. Moreover, the self-assembly pattern 207 is also formed on the film 202 to be processed through the neutral film 211.

Since the neutral film 211 is formed on the film 202 to be processed, even if the width (width of the horizontal direction in the drawing) of the film 202 to be processed is large, above the film 202 to be processed, phase separation of the block polymer layer 206 is carried out regularly, and the self-assembly pattern 207 is obtained.

In addition, when applying the PGMEA solution of a block copolymer on the self-assembly pattern 105, the phase separation pattern of the self-assembly pattern 105 may be dissolved with a solvent (in this case PGMEA, for example). Such a problem can be prevented by using a solvent type that is different with the first solution applied in the process shown in FIG. 22, and the second solution applied in the process shown in FIG. 24. Or the above problems can be prevented by adding a cross-linking agent (thermal cross-linking agent) to the first solution, and cross-linking it again after forming the phase separation pattern of the self-assembly pattern 105, then applying the second solution after that. Changing a solvent type or adding a cross-linking agent to the solution is not limited to the first solution and the second solution, and they can also be applied as needed when repeatedly applying the solution of a block copolymer in the subsequent process.

Figure 26:
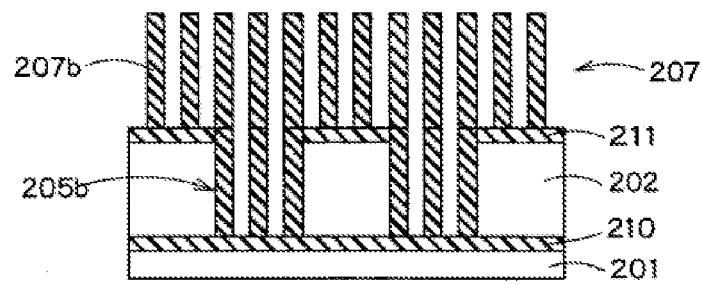

Next, as shown in FIG. 26, the line-and-space pattern of high aspect ratio can be obtained by removing alternatively the first polymer portions 205a and 207a (for example, the first polymer portions 205a and 207a that include PMMA(s)) in self-assembly patterns 205 and 207 by development process.

Figure 27:
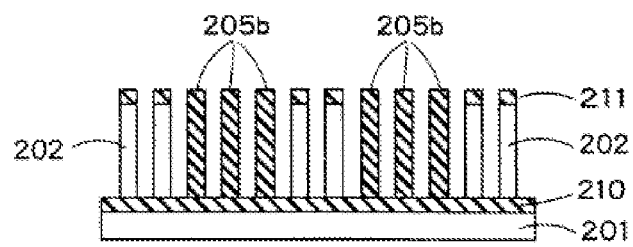

Next, as shown in FIG. 27, the second polymer portion 207b of the self-assembly phase 207 and the film 202 to be processed are etched back. At this time, it is etched so that the second polymer portion 207b of the self-assembly phase 207 and the film 202 to be processed may become equivalent. In other words, the film 202 to be processed is processed by masking the second polymer portion 207b. Thus, the pattern shape of the second polymer portion 207b of the self-assembly pattern 207 is transferred to the film 202 to be processed.

Then, the lower layer substrate 201 may be processed by masking the second polymer portion 205b of the self-assembly pattern 205 and the film 202 to be processed.

Thus, in the present embodiment, the first microphase separation pattern is formed in the graphoepitaxy, the second microphase separation pattern is formed by using these as the chemical epitaxy on the graphoepitaxy and the first microphase separation pattern, and the pattern shape of the second microphase separation pattern is transferred to the graphoepitaxy. Therefore, the area in which the graphoepitaxy is formed does not become useless, so the substrate can be used effectively. Moreover, since the neutral film is prepared on the upper surface and the undersurface of the graphoepitaxy, the first microphase separation pattern and the second microphase separation pattern can be formed easily.

Figure 28:
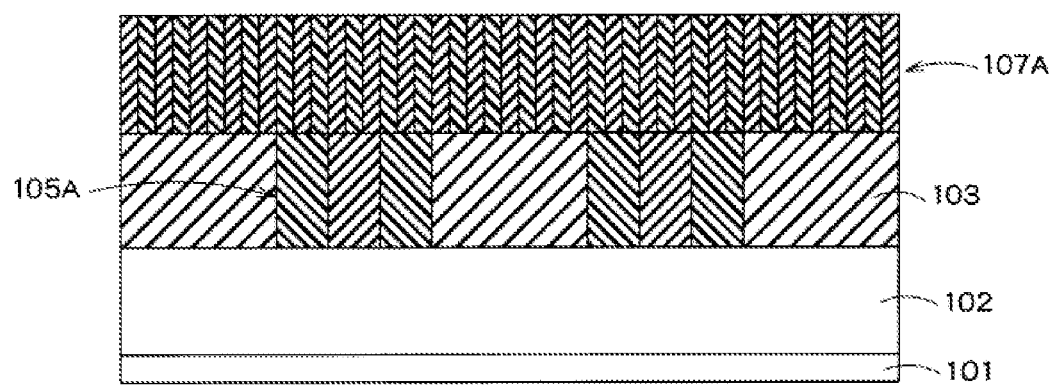
FIG. 28 is a cross-sectional view illustrating a pattern forming method according to a modified embodiment.

In the first to third embodiments, the self-assembly patterns 107 and 207 may become those with pitch narrower than the lower layer self-assembly patterns 105 and 205, by adjusting the material of the block polymer layers 104, 106, 204, and 206. For example, as shown in FIG. 28, in the first embodiment, the self-assembly pattern 107A of a pitch narrower than the self-assembly pattern 105A can be formed. The pitch of the self-assembly pattern 105A will be n times (n is an integer greater than or equal to 2) the pitch of the self-assembly pattern 107A. The pattern based on the self-assembly pattern 107A of a narrow pitch is transferred to the resist 103.

In the first to third embodiments, although microphase separation of the block polymer layer is carried out and the lamella self-assembly pattern is formed, the self-assembly pattern of other shapes, such as the shape of a cylinder (vertical or horizontal to the graphoepitaxy concave portion bottom) may be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   forming a graphoepitaxy on a substrate, the graphoepitaxy having a plurality of depressions and a plurality of projections;
   forming a first self-assembly material layer in the depressions of the graphoepitaxy, the first self-assembly material layer having at least a first segment and a second segment;
   forming a first self-assembly pattern by phase separating the first self-assembly material layer, the first self-assembly pattern having a first region containing the first segment and a second region containing the second segment;
   forming a second self-assembly material layer on the first self-assembly pattern and a surface of the projections, the second self-assembly material layer having a third segment and a fourth segment, wherein a solvent used in the formation of the first self-assembly material layer differs from a solvent used in the formation of the second self-assembly material layer; and
   forming a second self-assembly pattern by phase separating the second self-assembly material layer, the second self-assembly pattern having a third region containing the third segment and a fourth region containing the fourth segment.

2. The pattern forming method of claim 1, wherein a pitch of the first self-assembly pattern is n times a pitch of the second self-assembly pattern.

3. The pattern forming method of claim 1, wherein
   a solution used in the formation of first self-assembly material layer contains a thermal cross-linking agent.

4. The pattern forming method of claim 1, wherein the projected portion has a neutral surface for the third segment and the fourth segment.

5. The pattern forming method of claim 4, wherein a pitch of the first self-assembly pattern is n times a pitch of the second self-assembly pattern.

6. The pattern forming method of claim 4, wherein a solution used in the formation of first self-assembly material layer contains a thermal cross-linking agent.

7. The pattern forming method of claim 1, wherein the first segment and the third segment comprise the same polymer.

8. The pattern forming method of claim 7, wherein the projected portion has a neutral surface for the third segment and the fourth segment.

9. The pattern forming method of claim 8, wherein a solution used in the formation of first self-assembly material layer contains a thermal cross-linking agent.

10. The pattern forming method of claim 7, wherein the second segment and the fourth segment comprise the same polymer.

11. The pattern forming method of claim 10, wherein the projected portion has a neutral surface for the third segment and the fourth segment.

12. The pattern forming method of claim 10, wherein a pitch of the first self-assembly pattern is n times a pitch of the second self-assembly pattern.

13. The pattern forming method of claim 10, wherein a solution used in the formation of first self-assembly material layer contains a thermal cross-linking agent.

14. A pattern forming method, comprising:
   forming a resist layer on a substrate, the resist layer having a plurality of projections adjacent to a plurality of depressions;
   forming a first self-assembly material layer on each of the plurality of depressions of the resist layer, the first self-assembly material layer including at least a first segment and a second segment;
   forming a first self-assembly pattern in the first self-assembly material layer, the first self-assembly pattern having a first region containing the first segment and a second region containing the second segment;
   forming a second self-assembly material layer on the first self-assembly pattern and exposed portions of the resist layer, the second self-assembly material layer including a third segment and a fourth segment, wherein a solvent solution used in the formation of the first self-assembly material layer differs from a solvent solution used in the formation of the second self-assembly material layer; and
   forming a second self-assembly pattern in the second self-assembly material layer, the second self-assembly pattern having a third region containing the third segment, and a fourth region containing the fourth segment,
   wherein the first segment and the third segment each comprise a first polymer, and the second segment and the fourth segment each comprise a second polymer that is different from the first polymer.

15. The pattern forming method of claim 14, wherein a pitch of the first self-assembly pattern is n times a pitch of the second self-assembly pattern.

16. A pattern forming method, comprising:
   forming a graphoepitaxy on a substrate, the graphoepitaxy having a plurality of depressions and a plurality of projections;
   forming a first self-assembly material layer in the depressions of the graphoepitaxy, the first self-assembly material layer having at least a first segment and a second segment;
   forming a first self-assembly pattern by phase separating the first self-assembly material layer, the first self-assembly pattern having a first region containing the first segment and a second region containing the second segment;
   forming a second self-assembly material layer on the first self-assembly pattern and a surface of the projections, the second self-assembly material layer having a third segment and a fourth segment, wherein a pitch of the first self-assembly pattern is n times a pitch of the second self-assembly pattern, n being an integer greater than or equal to 2; and
   forming a second self-assembly pattern by phase separating the second self-assembly material layer, the second self-assembly pattern having a third region containing the third segment and a fourth region containing the fourth segment.

* * * * *